United States Patent
Shiu et al.

(10) Patent No.: US 6,885,711 B2
(45) Date of Patent: Apr. 26, 2005

(54) TURBO DECODER WITH MULTIPLE SCALE SELECTIONS

(75) Inventors: Da-shan Shiu, San Diego, CA (US); Rajesh Sundaresan, Santa Clara, CA (US)

(73) Assignee: Qualcomm Inc, San Diego, CA (US)

( * ) Notice: Subject to any disclaimer, the term of this patent is extended or adjusted under 35 U.S.C. 154(b) by 826 days.

(21) Appl. No.: 09/893,046

(22) Filed: Jun. 27, 2001

(65) Prior Publication Data

US 2003/0007577 A1 Jan. 9, 2003

(51) Int. Cl.[7] .............................................. H03M 13/29
(52) U.S. Cl. ........................ 375/340; 714/755; 714/780; 714/794
(58) Field of Search ................................ 375/262, 340, 375/341; 714/755, 780, 786, 794

(56) References Cited

U.S. PATENT DOCUMENTS

| | | | |
|---|---|---|---|
| 6,175,590 B1 | 1/2001 | Stein | 375/225 |
| 6,393,076 B1 * | 5/2002 | Dinc et al. | 374/341 |
| 2002/0131532 A1 * | 9/2002 | Chi et al. | 375/341 |

OTHER PUBLICATIONS

Yufei Wu et al: "The Influence Of Quantization And Fixed Point Arithmetic Upon The BER Performance Of Turbo Codes", Vehicular Technology Conference, 1999 IEEE 49th Houston, TX, May 16, 1999, pp. 1683–1687.

Czaja S et al: "Variable Data Rate Viterbi Decoder With Modified LOVA Algorithm", Microelectronics and VLSI, 1995. Tencon '95, IEEE Region 10 International Conference of Hong Kong, Nov. 6, 1995, pp. 472–475.

Pietrobon S. S: "Implementation And Performance Of A Turbo/Map Decoder", International Journal Of Satellite Communications, John Wiley and Sons, US., vol. 16, No. 1, 1998, pp. 23–46, XP000856961.

* cited by examiner

*Primary Examiner*—Amanda T. Le
(74) *Attorney, Agent, or Firm*—Philip R. Wadsworth; Charles D. Brown; George C. Pappas (57) ABSTRACT

Techniques to improve the performance of a Turbo decoder when scale information for the bits in a code segment to be decoded is not known. A number of hypotheses are formed for the code segment, with each hypothesis corresponding to a particular set of one or more values for a set of one or more parameters used for decoding the code segment. For the MAP decoding scheme, these parameters may be for the sequence of scaling factors used to scale the bits prior to decoding and/or a scale used to evaluate a (e.g., min*) function for the MAP decoding. The code segment is decoded based on the MAP decoding scheme and in accordance with each hypothesis. The quality of the decoded result for each hypothesis is determined based on one or more performance metrics. The decoded bits for the best hypothesis are provided as the Turbo decoder output.

22 Claims, 7 Drawing Sheets

TURBO DECODER WITH MULTIPLE SCALE SELECTIONS

BACKGROUND

I. Field

The present invention relates to data communication. More particularly, the present invention relates to techniques to Turbo decode a code segment with unknown scale information in a manner to provide improved performance.

II. Background

Wireless communication systems are widely deployed to provide various types of communication such as voice, packet data, and so on. These systems may be based on code division multiple access (CDMA), time division multiple access (TDMA), or some other multiple access techniques. A CDMA system provides certain advantages over other types of system, including increased system capacity.

A CDMA system may be designed to support one or more CDMA standards such as IS-95, W-CDMA, cdma2000, and others. Each standard typically defines the processing of data prior to transmission on the forward and reverse links. For example, voice and/or packet data may be coded at a particular data rate, formatted into a defined frame format, and processed (e.g., encoded for error correction and/or detection, interleaved, and so on) in accordance with a particular processing scheme.

Many newer CDMA standards employ a parallel concatenated convolutional encoder (often referred to as a Turbo encoder), which may be selected for encoding a code segment (e.g., a data packet) prior to transmission. The Turbo encoder employs two constituent encoders operated in parallel and in combination with a code interleaver. The code interleaver shuffles (i.e., interleaves) the information bits in the code segment in accordance with a defined interleaving scheme. One constituent encoder encodes the information bits in the code segment to generate a first sequence of parity bits, and the other constituent encoder encodes the shuffled information bits to generate a second sequence of parity bits. The information bits and some or all of the parity bits in the first and second sequences are transmitted.

A complementary (and computationally intensive) Turbo decoding is performed at a receiver unit. For each Turbo encoded segment, the received (soft value) bits are typically scaled, quantized, and stored to a buffer. The information and parity bits for the first constituent encoder are then retrieved from the buffer and decoded by a first constituent decoder based on the first constituent code to provide "extrinsic" information indicative of adjustments in the confidence in the detected values for the information bits. Intermediate results that include the extrinsic information from the first constituent decoder are then stored to a storage unit in an interleaved order matching the code interleaving used at the transmitter unit.

The intermediate results and the parity bits from the second constituent encoder are then retrieved from their respective sources and decoded by a second constituent decoder based on the second constituent code to provide extrinsic information indicative of further adjustments in the confidence in the detected values for the information bits. Intermediate results that comprise the extrinsic information from the second constituent decoder are then stored to the storage unit in a de-interleaved order complementary to the code interleaving used at the transmitter unit. The intermediate results are used by the next iteration of the first constituent decoder. The decoding by the first and second constituent decoders is iterated a number of times to yield the final decoded result.

Each constituent decoder may be implemented as a maximum a posteriori (MAP) decoder that attempts to minimize the bit error of a code segment. For each information bit to be decoded by the MAP decoder, a number of computations are performed to derive the extrinsic information. For certain decoder implementations, the accuracy of the computations depends on knowledge of the "scale" of the input bits (i.e., the samples) provided to the MAP decoder. The scale information may include the variance and amplitude of the samples provided to the MAP decoder. If the decoding is performed with no knowledge or a wrong assumption of the scale of the input bits, then the decoding performance can degrade.

There is therefore a need for a Turbo decoder that can decode a code segment with unknown scale information in a manner to provide improved performance.

SUMMARY

Aspects of the present invention provide techniques to Turbo decode a code segment in a manner to provide improved decoding result. For some Turbo decoding schemes (such as the commonly used maximum a posteriori (MAP) decoding scheme), the performance of the decoding is dependent on knowledge of scale information for the bits to be decoded. Such scale information may relate to the variance and amplitude of the bits to be decoded, and may be needed to accurately evaluate a particular function for the MAP decoding. If wrong scale information is used to decode the code segment, then the performance of the MAP decoding may degrade because the function may not be accurately evaluated.

Aspects of the invention provide techniques to improve the performance of a Turbo decoder when the scale information for the received bits is not known. In general, a number of hypotheses are formed for a given code segment to be decoded, with each hypothesis h corresponding to a particular set of one or more values for a set of one or more parameters used for decoding the code segment. For the MAP decoding scheme, these parameters may be for (1) the sequence of scaling factors used to scale the received bits in the code segment to derive the bits to be decoded, and/or (2) a scale used to evaluate a function (e.g., a min* function) for decoding the code segment.

The code segment is decoded based on the MAP decoding scheme and in accordance with each hypothesis. The quality of the decoded result for each hypothesis is then determined based on one or more performance metrics (e.g., CRC check, correlation metric, re-encoded correlation metric, and so on). The quality of the decoded results for all hypotheses are compared, and the decoded bits for the hypothesis that provides the "best" decoded result, as determined by the performance metrics, are provided as the Turbo decoder output for the code segment.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
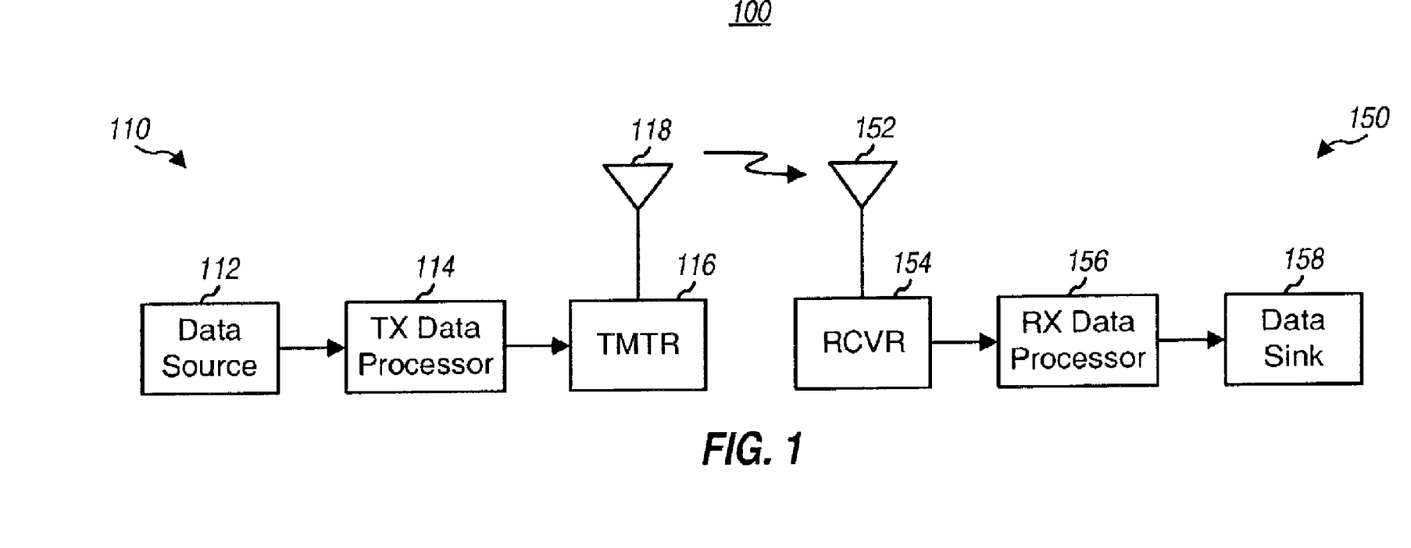
FIG. 1 is a simplified block diagram of a communication system capable of implementing various aspects and embodiments of the invention.

FIG. 1 is a simplified block diagram of a communication system 100 capable of implementing various aspects and embodiments of the invention. In an embodiment, communication system 100 is a CDMA system that conforms to cdma2000, W-CDMA, IS-856, and/or some other CDMA standards. At a transmitter unit 110, data is sent, typically in blocks, from a data source 112 to a transmit (TX) data processor 114 that formats, codes, and processes the data to generate one or more analog signals. The analog signals are then provided to a transmitter (TMTR) 116 that (quadrature) modulates, filters, amplifies, and upconverts the signal(s) to generate a modulated signal. The modulated signal is then transmitted via one or more antennas 118 (only one is shown in FIG. 1) to one or more receiver units.

At a receiver unit 150, the transmitted signal is received by one or more antennas 152 (again, only one is shown) and provided to a receiver (RCVR) 154. Within receiver 154, the received signal(s) are amplified, filtered, downconverted, (quadrature) demodulated, and digitized to generate samples. The samples are then processed and decoded by a receive (RX) data processor 156 to recover the transmitted data. The processing and decoding at receiver unit 150 are performed in a manner complementary to the processing and coding performed at transmitter unit 110. The recovered data is then provided to a data sink 158.

The signal processing described above supports transmissions of voice, video, packet data, messaging, and other types of communication in one direction. A bi-directional communication system supports two-way data transmission. However, the signal processing for the other direction is not shown in FIG. 1 for simplicity.

Figure 2:
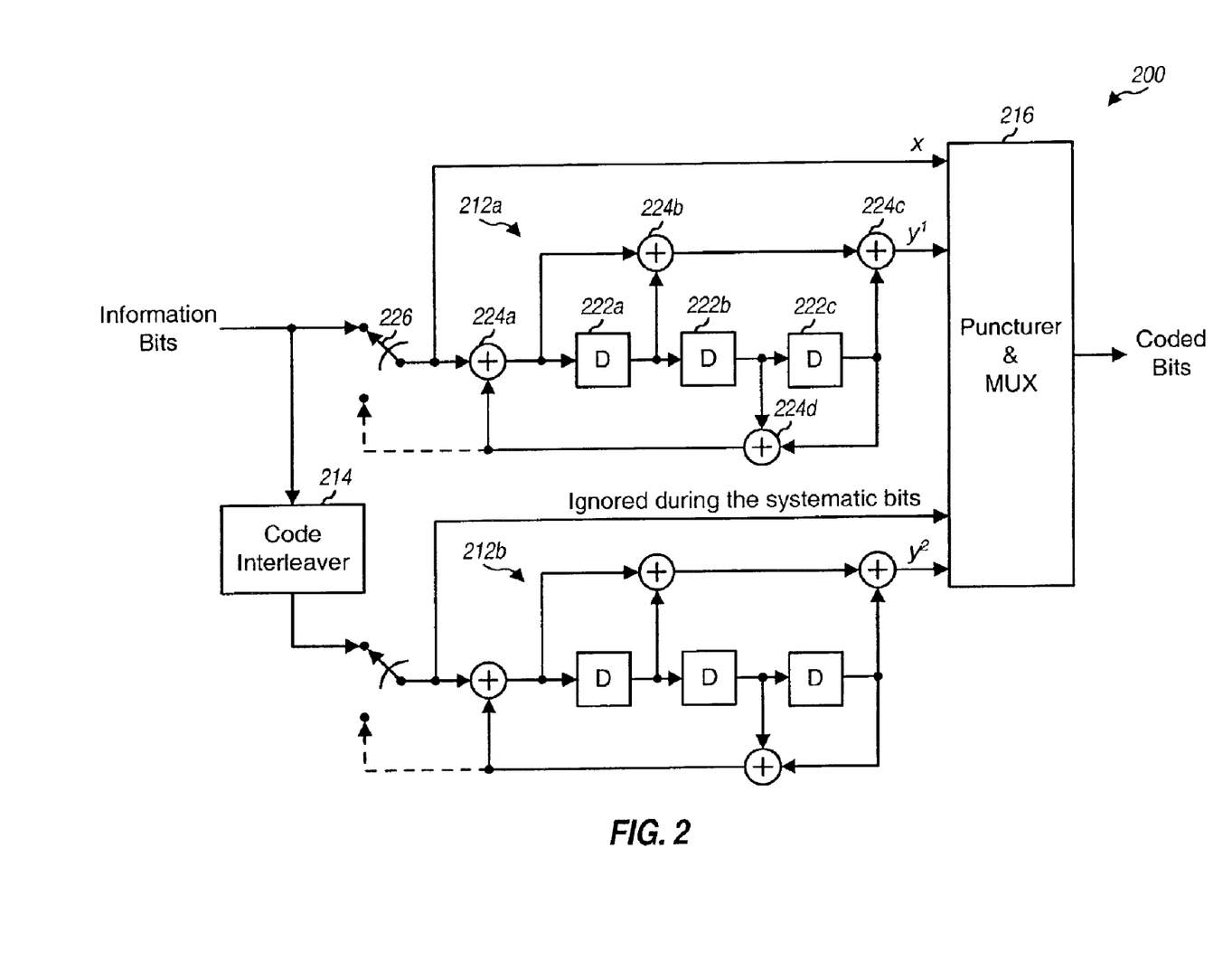
FIG. 2 is a diagram of a Turbo encoder defined by the W-CDMA standard.

FIG. 2 is a diagram of a parallel concatenated convolutional encoder 200 (which is also referred to as a Turbo encoder) defined by the W-CDMA standard. Turbo encoder 200 may be used to perform the channel coding within TX data processor 114 in FIG. 1. Turbo encoder 200 includes a pair of constituent encoders 212a and 212b, a code interleaver 214, and a puncturer and multiplexer 216. Code interleaver 214 receives and interleaves the information bits in a code segment (e.g., a data packet) in accordance with a particular interleaving scheme (e.g., as defined by the standard being implemented).

Each constituent encoder 212 receives either linear-order or interleaved information bits, encodes the received information bits with a defined constituent code, and provides a sequence of parity bits. Puncturer and multiplexer 216 receives the information bits and the parity bits from both constituent encoders 212a and 212b, punctures (i.e., deletes) zero or more parity bits to obtain the desired number of bits, and multiplexes the unpunctured information and parity bits into a sequence of coded bits. Zero or more coded bits may also be repeated instead of punctured. However, for simplicity and without loss of generality, puncturer and multiplexer 216 can perform puncturing and/or repetition, as necessary.

In the embodiment shown in FIG. 2, each constituent encoder 212 includes three series-coupled delay elements 222, four modulo-2 adders 224, and a switch 226. Initially, the states of delay elements 222 are set to zeros and switch 226 is in the up position. Then, for each information bit in the code segment, adder 224a performs modulo-2 addition of the information bit x with the output bit from adder 224d and provides the result to delay element 222a. Adders 224b and 224c receive and perform modulo-2 addition of the bits from adder 224a and delay elements 222a and 222c, and provide the parity bit y. Adder 224d performs modulo-2 addition of the bits from delay elements 222b and 222c.

After all $N_B$ information bits in the code segment have been encoded, switch 226 is moved to the down position and three zero ("0") tail bits are provided to constituent encoder 212a. Constituent encoder 212a then encodes the three tail bits and provides six tail parity bits.

For each segment of $N_B$ information bits, constituent encoder 212a provides $N_B$ parity bits and the first six tail parity bits $y^1$, and constituent encoder 212b provides $N_B$ parity bits and the last six tail parity bits $y^2$. For each segment, puncturer and multiplexer 216 receives $N_B$ information bits x, $N_B+6$ parity bits $y^1$ from encoder 212a, and $N_B+6$ parity bits $y^2$ from encoder 212b. Puncturer and multiplexer 216 may puncture (i.e., delete) a number of parity bits to provide the required number of coded bits, which comprises the unpunctured information and parity bits.

The sequence (or vector) X of information and parity bits provided by Turbo encoder 200 may be expressed as:

$$X=\{x_1\ y_1^1\ y_1^2\ x_2\ y_2^1\ y_2^2\ \ldots\ x_{N_B}\ y_{N_B}^1\ y_{N_B}^2\ t_1\ \ldots\ t_{12}\}.$$

Again, all or a subset of these bits may be transmitted from transmitter unit 110 to receiver unit 150.

For each bit to be transmitted, a value A is transmitted if the bit is a zero ("0") and a value −A is transmitted if the bit is a one ("1"). Each transmitted bit is distorted by channel noise, the analog and digital signal processing on the bit at both the transmitter and receiver units, and other phenomenon. The received sequence of bits at the receiver unit may be expressed as:

$$V=\{v_1\ v_2\ v_3\ \ldots\ v_{3N}\}, \quad\quad\quad \text{Eq (1)}$$

where V is the entire sequence of received bits including those corresponding to the tail bits and $N=N_B+4$. Each received bit $v_k$ in the sequence V can be expressed as:

$$v_k = \begin{cases} A_k + \sigma_k z_k & \text{if the } k\text{-th bit is 0,} \\ -A_k + \sigma_k z_k & \text{otherwise} \end{cases} \quad \text{Eq (2)}$$

where $Z=\{z_1\ z_2\ z_3\ \ldots\ z_{3N}\}$ is a vector of independent and identically distributed (iid) random variables having a normal unit in a static scenario, $A_k$ is the amplitude for the received bit and is typically equal to A, and $\sigma_k$ is the standard deviation of the random variables $z_k$ for the received bit due to channel noise, and can be approximated as $\sigma_k = \sigma$ for k=1, 2, . . . 3N.

Under fading conditions or under repetition conditions after the appropriate accumulation of symbols corresponding to identical bits, the received signal amplitude may differ from the transmitted signal amplitude.

Figure 3:
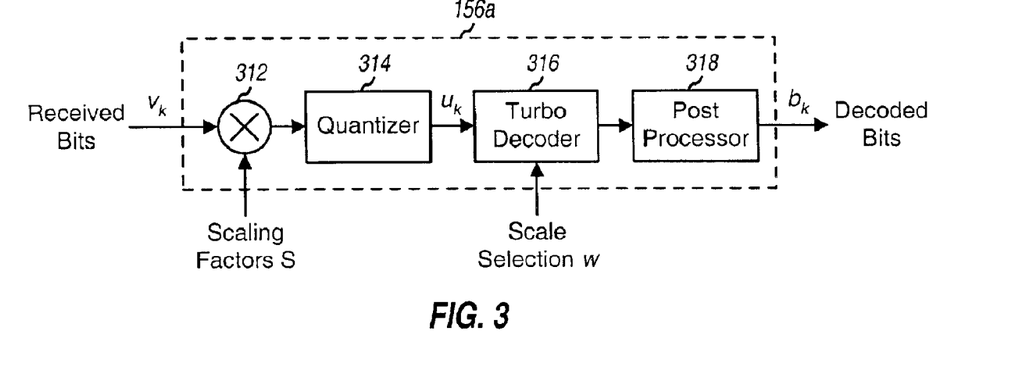
FIG. 3 is a block diagram that symbolically illustrates some of the processing within a RX data processor at the receiver unit.

FIG. 3 is a block diagram that symbolically illustrates some of the processing within RX data processor 156 at the receiver unit. A received signal is initially conditioned, digitized, and digitally processed (e.g., filtered, despread, decovered, and so on) by receiver 154 to provide a "soft" value for each received bit $v_k$. The soft value for the received bit $v_k$ may have many (e.g., 16) bits of resolution after the digital signal processing. For many decoder implementations, it is not practical or necessary to store this many bits of resolution for each received bit. In particular, since an entire code segment of bits needs to be stored for Turbo decoding, a very large storage unit would be needed to store many bits of resolution for each bit in the code segment to be decoded.

To reduce the storage requirement, the received bits $V = \{v_1 \ v_2 \ v_3 \ \ldots \ v_{3N}\}$ are effectively scaled via a multiplier 312 by a sequence of scaling factors $S = \{s_1 \ s_2 \ s_3 \ \ldots \ s_{3N}\}$. One scaling factor may be provided for each received bit $v_k$, and the scaling may be performed element by element for the sequence V. The scaled bits are then quantized by a quantizer 314 to provide the decoder input bits $U = \{u_1 \ u_2 \ u_3 \ \ldots \ u_{3N}\}$. The input bits $u_k$ to the Turbo decoder are thus scaled and quantized version of the received bits $v_k$ and may have a reduced resolution (e.g., of 4, 5, 6, or some other number of bits).

The scaling factors $s_k$ are selected such that the information in the received bits $v_k$ are well represented and within a proper range in the quantized output $u_k$. If the scaling factors are too large, then clipping of the scaled bits would occur during quantization and the resultant clipping noise can degrade the decoding performance. And if the scaling factors are too small, then the signal amplitude of the scaled bits would be small relative the quantization noise and the decoding performance also degrades.

If multiple bits are received for a particular coded bit (i.e., repeated bits for the coded bit), then a complementary processing is performed at the receiver unit for these repeated bits. The repeated bits corresponding to the code bit are initially scaled so that the variance over mean is constant for all symbols for this code bit, and the scaled bits are then added together to obtain one symbol for the code bit. If a coded bit is punctured at the transmitter unit, a soft symbol of zero ("0") (i.e., an erasure) is inserted for the punctured bit so that no priority is given to a +1 (bit "0") or a −1 (bit "1").

A Turbo decoder 316 receives the input bits $u_k$ and additional information regarding the scale of the input bits. Turbo decoder 316 then decodes the input bits $u_k$ using the scale information and provides a candidate sequence of decoded bits. A post processor 318 may further process the decoded bits to provide an indication of the quality of the decoded result. For example, post processor 318 may perform CRC check of the decoded results, if CRC bits are included in the transmitted code segment. Other performance metrics may also be evaluated for the decoded result to provide other indications of the decoding performance, as described below.

Figure 4:
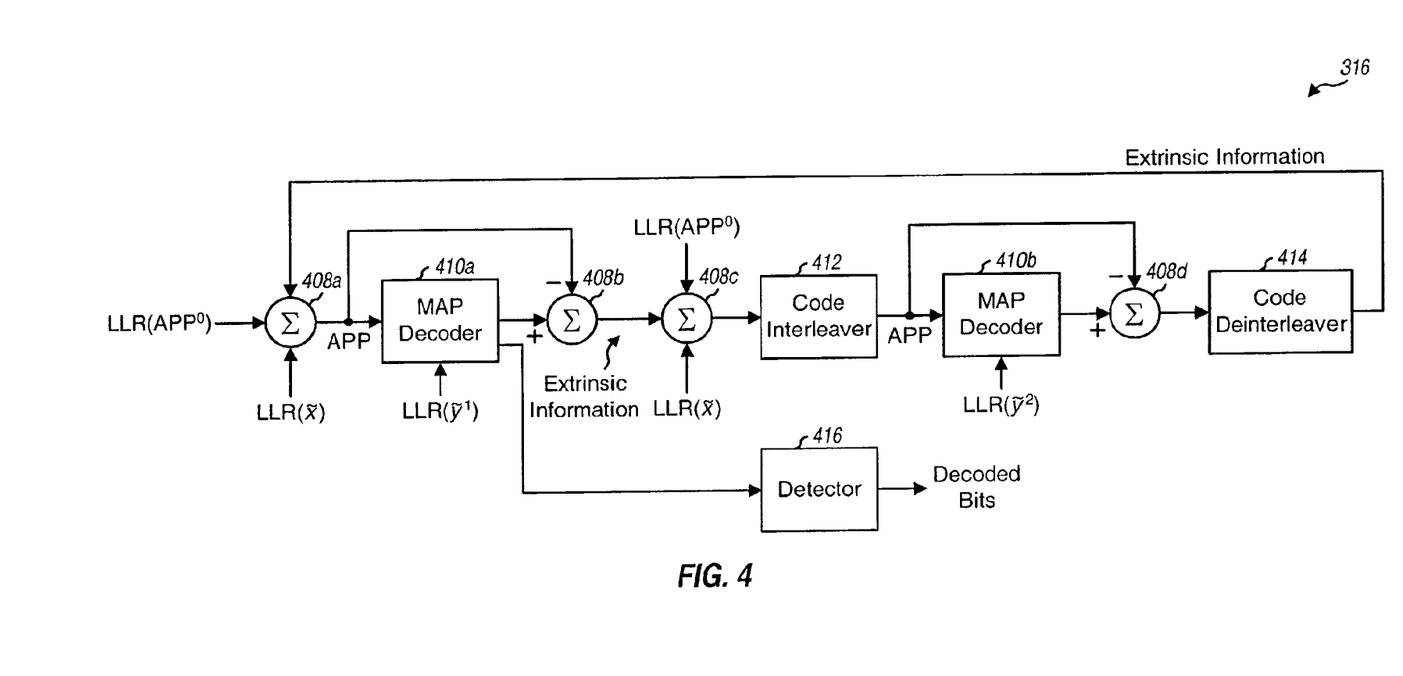
FIG. 4 is a block diagram of a design of a Turbo decoder.

FIG. 4 is a block diagram of a specific design for Turbo decoder 316. In this design, Turbo decoder 316 includes two constituent decoders 410*a* and 410*b*, a code interleaver 412, a code deinterleaver 414, and a detector 416. Each constituent decoder 410 is typically implemented as a soft-input/soft-output (SISO) maximum a posteriori (MAP) decoder that attempts to minimize the bit error of a code sequence. However, other types of decoder may also be used, such as a decoder that implements the soft output Viterbi algorithm (SOVA).

The MAP decoder typically operates on the log-likelihood ratio (LLR) of the input bits $u_k$, which includes the quantized information and parity bits and can be expressed as:

$$U = \{u_1 \ u_2 \ u_3 \ \ldots u_{3N}\}$$
$$= \{\tilde{x}_1 \ \tilde{y}_1^1 \ \tilde{y}_1^2 \ \tilde{x}_2 \ \tilde{y}_2^1 \ \tilde{y}_2^2 \ldots \tilde{x}_{N_B} \ \tilde{y}_{N_B}^1 \ \tilde{y}_{N_B}^2 \ \tilde{t}_1 \ldots \tilde{t}_{12}\}.$$

The LLR of an input bit $x_k$ at time k can be computed as:

$$LLR(x_k) = \log\left(\frac{Pr(x_k = 1 \mid U)}{Pr(x_k = 0 \mid U)}\right). \quad \text{Eq (3)}$$

The LLR of an input bit $x_k$ is the logarithm of the ratio of the probability of the bit being a zero ("0") given the received sequence U over the probability of the bit being a one ("1"). The probabilities, $Pr(x_k=0|U)$ and $Pr(x_k=1|U)$, for each input bit are based on the soft value for that bit and the sequence of bits received for the code segment being decoded. The LLR for an erasure (i.e., a punctured bit) is indicative of equal confidence in the bit being a zero or a one (i.e., LLR=0).

In the embodiment shown in FIG. 4, a summer 408*a* receives and sums LLR(APP⁰), LLR($\tilde{x}_k$), and the extrinsic information from deinterleaver 414 to provide a priori probabilities (APP) for decoder 410*a*. LLR(APP⁰) is the log likelihood ratio derived from an underlying assumption of the information bits. If each information bit in a code segment is assumed to be equally likely to be either zero ("0") or one ("1"), then LLR(APP⁰) is equal to zero for all bits in the code segment, and any parts related to LLR (APP⁰) are ignored. The extrinsic information from deinterleaver 414 is set to zero for the first decoding iteration. LLR($\tilde{x}_k$) is the log-likelihood ratio of the received information bits $\tilde{x}_k$.

Decoder 410*a* receives the APP from summer 408*a* and LLR($\tilde{y}_k^1$), which are the LLRs of the parity bits $\tilde{y}_1^1$ received from the first constituent encoder. LLR($\tilde{y}_k^1$) includes erasures for punctured (i.e., non-transmitted) parity bits, if any. Decoder 410*a* then decodes the APP and LLR($\tilde{y}_k^1$) based on the MAP algorithm to generate a posteriori probabilities. The APP is then subtracted from the a posteriori probabilities by a summer 408*b* to provide extrinsic information, $e_k^1$, which is indicative of corrections/adjustments in the confidence of the values for the information bits $\tilde{x}_k$ contributed by the parity bits $\tilde{y}_k^1$.

The extrinsic information, $e_k^1$, from summer 408*b* is summed with the information bit LLRs, LLR($\tilde{x}_k$), and the intermediate results (which are APP for the next decoder) are stored to code interleaver 412. Code interleaver 412 implements the same code interleaving scheme used at the Turbo encoder (e.g., the same scheme used for code interleaver 214 in FIG. 2).

Decoder 410*b* receives the interleaved APP from interleaver 412 and LLR($\tilde{y}_k^2$), which are the LLRs of the parity bits $\tilde{y}_k^2$ received from the second constituent encoder. Decoder 410*b* then decodes the APP and LLR($\tilde{y}_k^2$) in accordance with the MAP algorithm to generate a posteriori probabilities. The APP is then subtracted from the a posteriori probabilities by a summer 408*d* to provide extrinsic information, $e_k^2$, which is indicative of further corrections/adjustments in the confidence of the values for the information bits $\tilde{x}_k$ contributed by the received parity bits $\hat{y}_k^2$. The extrinsic information, $e_k^2$, comprises the intermediate results from decoder 410*b*, which are stored to code deinterleaver 414. Deinterleaver 414 implements a deinterleaving scheme complementary to the interleaving scheme used for interleaver 412.

The decoding of the information bit LLRs is iterated a number of times (e.g., 12, 16, 20, or possibly more times). With each iteration, greater confidence is gained for the detected values of the information bits. After all the decoding iterations have been completed, the final LLRs are provided to detector 418, which provides hard-decision values (i.e., "0s" and "1s") for the received information bits based on their LLRs.

Each MAP decoder 410 performs calculations of the likelihood ratio, $\lambda_k$, which can be expressed as:

$$\lambda_k = \frac{Pr(x_k = 1 \mid U)}{Pr(x_k = 0 \mid U)}, \quad \text{Eq (4)}$$

where $x_k$ is the unknown (and to be detected) input bit into the encoder at time k, and U is the sequence of symbols input to the decoder (i.e., the received information and parity bits after scaling and quantization). The likelihood ratio, $\lambda_k$, represents the likelihood of bit $x_k$ being a one given the received sequence U over the likelihood of bit $x_k$ being a zero given the received sequence U.

The likelihood ratio, $\lambda_k$, can also be expressed as:

$$\lambda_k = \frac{\sum_m \alpha_k^m \beta_{k+1}^{f(1,m)} \delta_k^{1,m}}{\sum_m \alpha_k^m \beta_{k+1}^{f(0,m)} \delta_k^{0,m}}, \quad \text{Eq (5)}$$

where $\alpha_k^m$ represents a forward state metric at time k for the trellis state m (i.e., the probability of the received vector up to time k given the trellis state at time k being m), $\beta_{k+1}^{f(i,m)}$ represents a reverse state metric at time k for the trellis state m (i.e., the probability of the received vector from time k to the end of the trellis given that the next trellis state is f(i,m)), where f(i,m) represents the next state given the input i and the current state m), and $\delta_k^{i,m}$ is a branch metric at time k for state m and input i. The two summations in equation (5) are performed over all encoder states.

Figure 5A:
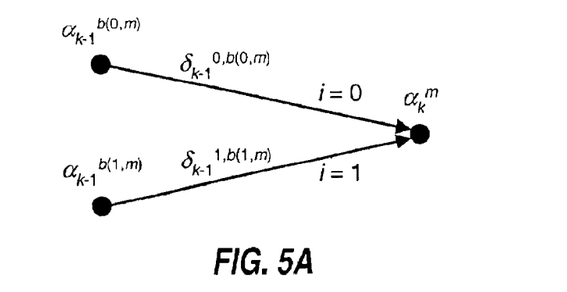
FIGS. 5A and 5B show graphical representations of the forward and reverse state metric calculations, respectively, for a MAP decoder.
Figure 5B:
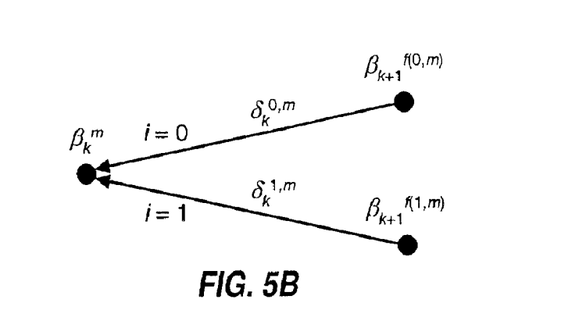

FIGS. 5A and 5B show graphical representations of the forward and reverse state metric calculations, respectively. The forward state metric may be calculated recursively, as follows:

$$\alpha_k^m = \sum_{i=0}^{1} \alpha_{k-1}^{b(i,m)} \delta_{k-1}^{i,b(i,m)}, \quad \text{Eq (6)}$$

where b(i,m) is the state in the previous time index k−1 from which a branch corresponding to input i transitions to state m. The reverse state metric may also be calculated recursively, as follows:

$$\beta_k^m = \sum_{i=0}^{1} \beta_{k+1}^{f(i,m)} \delta_k^{i,m}. \quad \text{Eq (7)}$$

As shown by the above equations (5) through (7), the MAP algorithm performs a number of multiplications, which are not easily performed in hardware. However, the algorithm may be transformed into the log domain by taking the logarithm (or the negative logarithm) of the terms. In the log domain, a multiplication of two terms transforms into a relatively simple addition, which can be performed by a min* function. The min* function can be expressed as:

$$\min^*(a,b) = -\ln(e^{-a} + e^{-b}) = \min(a,b) + p(g), \quad \text{Eq (8)}$$

where p(g) is a correction term and can be expressed as:

$$p(g) = -\ln(1 + e^{-g}),$$

where $$g = -|a-b|.$$

In the log domain, the terms described above can be defined as:

$$L_k = -\ln(\lambda_k),$$

$$A_k^m = -\ln(\alpha_k^m),$$

$$B_k^m = -\ln(\beta_k^m), \text{ and}$$

$$D_k^{i,m} = -\ln(\delta_k^{i,m}). \quad \text{Eq (9)}$$

The computations for the MAP algorithm can then be expressed as:

$$D_k^{i,m} = \max(0, i \cdot (\tilde{x}_k + APP)) + \max(0, \tilde{y}_k^1 \cdot c^{0,i,m}), \quad \text{Eq (10)}$$

$$A_k^m = \min^*((A_{k-1}^{b(0,m)} + D_{k-1}^{0,b(0,m)}), (A_{k-1}^{b(1,m)} + D_{k-1}1, b(1,m))), \quad \text{Eq (11)}$$

$$B_k^m = \min^*((B_{k+1}^{f(0,m)} + D_k^{0,m}), (B_{k+1}^{f(1,m)} + D_k^{1,m})), \text{ and} \quad \text{Eq (12)}$$

$$L_k = \min^*(A_k^m + B_{k+1}^{f(1,m)} + D_k^{1,m}) - \min^*(A_k^m + B_{k+1}^{f(0,m)} D_k 0, m) \forall m, \quad \text{Eq (13)}$$

where $c^{n,i,m}$ is the parity hypothesis for parity bit n, given the input bit i and state m. In equation (13), each of the two min* functions operates over all possible states m, similar to the summations in equation (5).

The derivation of the above equations for the MAP algorithm is well known in the art. A description of such derivation is provided by Steven S. Pietrobon in a paper entitled "Implementation and Performance of a Turbo/Map Decoder," International Journal of Satellite Communications, Vol. 16, 1998, pp. 23–46, and incorporated herein by reference.

The min* function is dependent on the scale information of the inputs a and b provided to the function. For the sequence of received bits $v_k$ shown in equation (2), the scaled bits can be expressed as:

$$s_k v_k = s_k A_k + s_k \sigma_k z_k.$$

The variance to mean ratio of a scaled bit can be expressed as:

$$w_k = \frac{s_k \sigma_k^2}{A_k},$$

where $w_k$ represents the "scale" of the input bit $u_k$ into the MAP decoder. The scaling factor $s_k$ is typically selected for each received bit $v_k$ in the code segment such that the quantity $s_k \sigma_k^2 / A_k$ for all scaled bits $u_k$ are approximately equal (i.e., $w_k = w$ for a given code segment). Various techniques may be used to estimate (or pre-measure) the appropriate scaling factors. These techniques may be MAP decoder related or may be some other coarse forms of decoder-metric combination before the Turbo decoder.

If the variance $\sigma_k^2$ and amplitude $A_k$ of the received bits $v_k$ are known, then the scaling factors $s_k$ can be selected as a function of $\sigma_k^2$, $A_k$, and the quantization resolution, such that the quantized bits $u_k$ (which are used as the inputs a and b to the min* function) have variances twice as large as their means, in absolute value, or $s_k \sigma_k^2 / A_k = 2$. In this case, the function p(g) for the min* function can be simply expressed as:

$$p(g) = -\ln(1 + e^{-g}). \quad \text{Eq (14a)}$$

However, if the scaling factors $s_k$ are such that $s_k \sigma_k^2 / A_k \neq 2$, then the function p(g) can be expressed in a more generalized form as:

$$p(g,w) = -0.5w \cdot \ln(1 + e^{-g/(0.5 \, w)}). \quad \text{Eq (14b)}$$

As can be seen from equation (14b), the scale information is needed to accurately evaluate the function p(g,w) for the min* function.

In certain MAP decoder implementations, the function p(g,w) shown in equation (14b) is implemented with lookup tables, which can expedite the evaluation of the min* function. A set of lookup tables may be provided for a set of scale values w. For example, five lookup tables may be provided for five values of w=0, 3, 6, 9, and 12. Depending on the value for the scale w (which may be determined based on the estimated or known values for $\sigma_k^2$, $A_k$, and the number of bits after quantization), the proper lookup table is used to evaluate the function p(g,w). For example, the lookup table for w=12 may be designed for use when the input bits $u_k$ have been properly scaled and quantized to 6-bits, the lookup table for w=6 may be designed for use when the input bits $u_k$ have been properly scaled and quantized to 5-bits, and the lookup table for w=3 may be designed for use when the input bits $u_k$ have been properly scaled and quantized to 4-bits.

In many instances, the variance $\sigma_k^2$ and amplitude $A_k$ of the received bits are not known. Instead, these quantities may be estimated based on various system parameters such as, for example, the bit rate used for a data transmission. The scaling factors $s_k$ are then selected based on the system parameters (and not necessarily on the scaling or the noise) such that a desired value for the scale w is obtained. However, if the actual scaling of the received bits deviates from the desired scaling due to any number of reasons (such as fading, power control, cell configuration, and so on), then the performance of the MAP decoder degrades because the wrong lookup table (i.e., for the wrong scale value) is used to evaluate the function p(g,w).

Aspects of the invention provide techniques to improve the performance of a Turbo decoder when the scale information for the received bits is not known. In general, a number of hypotheses are formed for a given code segment (e.g., a data packet) to be decoded. Each hypothesis h corresponds to a hypothesized sequence $S_h$ of scaling factors and a hypothesized scale $w_h$. The code segment is then decoded in accordance with each formed hypothesis, and the decoded result for each hypothesis is evaluated based on one or more performance metrics. The performance for all hypotheses are compared, and the specific hypothesis that provides the "best" decoded result, as determined by the performance metrics, is used for the code segment. Simulations have shown that using the techniques described herein, the achievable decoding performance approaches the theoretical limit, which may be bounded, e.g., by the quantized values for the scale w for which the lookup tables are generated. For example, if five lookup tables are provided for scale values of w=0, 3, 6, 9, and 12, then the decoding performance may be bounded by these quantized values for the scale w.

Figure 6:
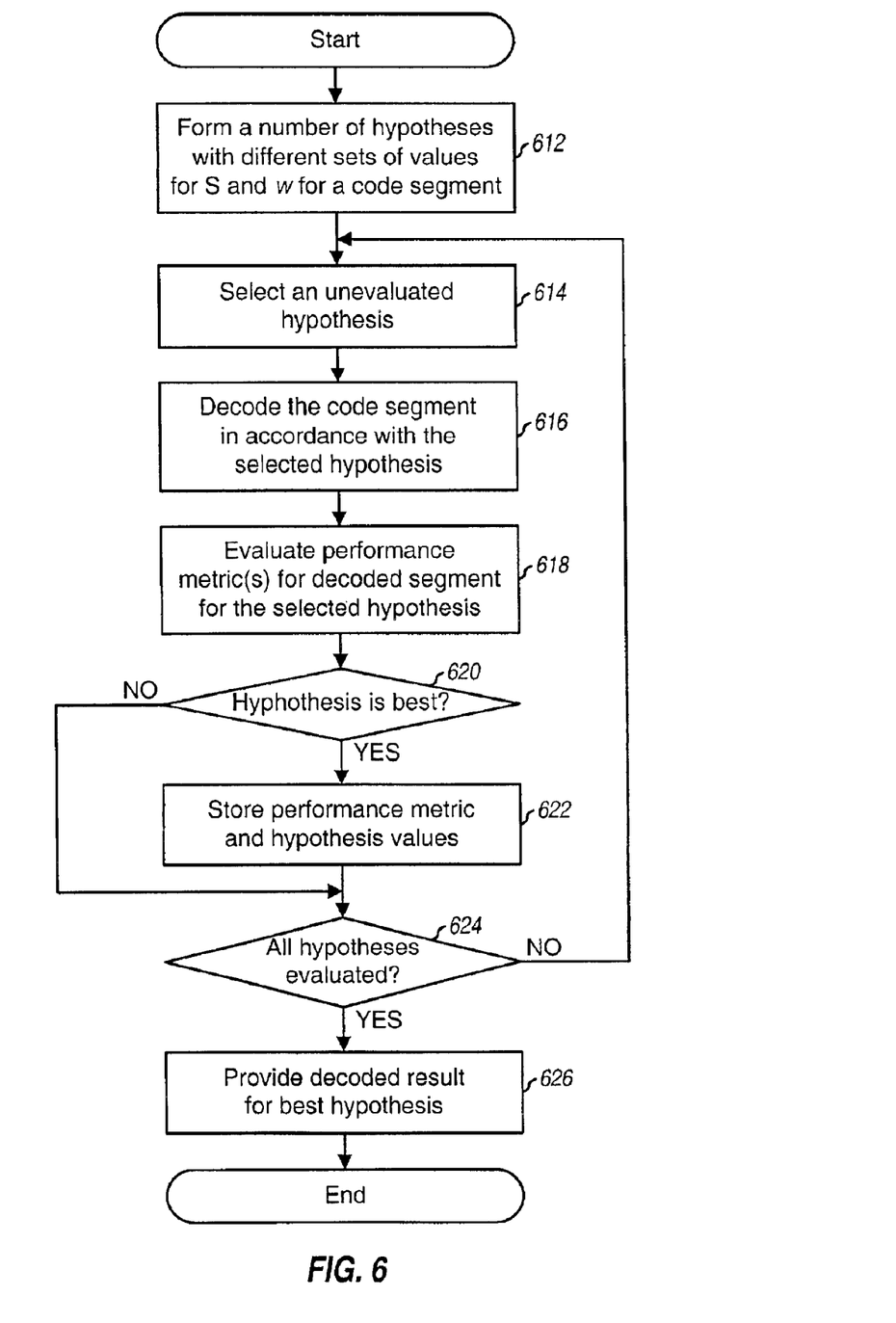
FIGS. 6 and 7 are flow diagrams for two Turbo decoding schemes, in accordance with embodiments of the invention.

FIG. 6 is a flow diagram of a process to Turbo decode a code segment, in accordance with an aspect of the invention. Initially, a number of hypotheses for the code segment are formed, with each hypothesis h corresponding to a specific sequence $S_h$ of scaling factors and a specific scale selection $w_h$, at step 612. The specific number of hypotheses to be formed is dependent on various considerations such as, for example, the amount of time available to decode the code segment, the confidence in the initial estimates of $\sigma_k^2$ and $A_k$, and so on.

An unevaluated hypothesis is then selected for evaluation, at step 614. In the first part of the evaluation, the code segment is Turbo decoded in accordance with the selected hypothesis (i.e., the particular $S_h$ and $w_h$), at step 616. This may entail scaling the received bits with the sequence $S_h$ of scaling factors, quantizing the scaled bits to the required number of bits of resolution (e.g., as determined by $\sigma_k^2$, $A_k$, and $S_h$), and decoding the quantized bits with the scale selection $w_h$ (e.g., using the lookup table for the specific value of $w_h$) to provide a candidate sequence of decoded bits. The quality of the decoded result for the hypothesis is then determined using one or more performance metrics, which are described below, at step 618.

A determination is then made whether the decoded result for the code segment based on the current hypothesis is the best thus far, at step 620. If this hypothesis is the best thus far, then the performance metric is stored for later comparison, at step 622. Other information may also be stored such as the hypothesis values (e.g., the scaling factor sequence $S_h$ and the scale $w_h$), the decoded results, and so on. The process then proceeds to step 624. Otherwise, if the current hypothesis is not the best, then the process simply proceeds from step 620 to step 624.

At step 624, a determination is made whether or not all hypotheses have been evaluated. If the answer is no, then the process returns to step 614 and another unevaluated hypothesis is selected for evaluation. Otherwise, if all hypotheses have been evaluated, the process proceeds to step 626 and the decoded result for the best hypothesis is provided. The process then terminates.

The decoding scheme shown in FIG. 6 represent a general form that may be used when the scaling information for the received bits is not known. In many practical implementations, the number of hypotheses that may be evaluated may be limited by various considerations. For example, a limited time period may be available to decode a code segment, which would then limit the number of hypotheses that may be evaluated. If the min* function is evaluated with a set of lookup tables, then the possible values for the scale w are also restricted. For example, five lookup tables may be provided for w=0, 3, 6, 9, and 12, in which case the scale w is restricted to these five values. Various variations to the decoding scheme shown in FIG. 6 may be contemplated and are within the scope of the invention. Some of these decoding schemes are described below.

Figure 7:
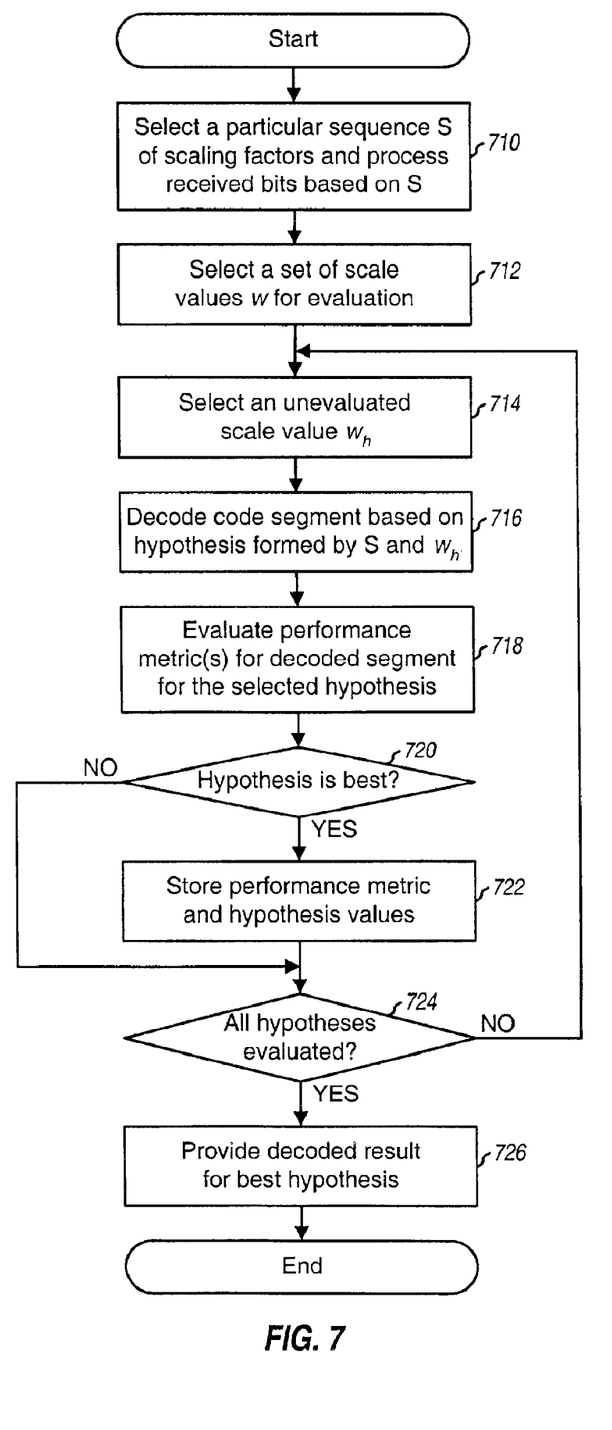

FIG. 7 is a flow diagram of a Turbo decoding scheme, in accordance with another embodiment of the invention. This decoding scheme evaluates a number of hypotheses with the same sequence S of scaling factors but different scale selections w. Initially, a particular sequence S of scaling factors is selected based on some criteria (e.g., the estimated values for $\sigma_k^2$ and $A_k$, the data rate of the code segment, and so on), at step 710. The received bits $v_k$ in a code segment are then scaled in accordance with the selected scaling factors and quantized to the desired number bits (e.g., determined based on the estimated $\sigma_k^2$ and $A_k$ and the selected S) to form the input bits $u_k$, which are then stored to a storage unit. A set of scale values $w_h$ is also selected for evaluation, at step 712. These scale values may be selected based on various criteria (e.g., the estimated values for $\sigma_k^2$ and $A_k$ and the selected S, the available time period to decode, and so on). For example, the scale values for all lookup tables may be selected for evaluation (e.g., $w_h$=0, 3, 6, 9, and 12).

An unevaluated scale value $w_h$ is then selected for evaluation, at step 714. The code segment is next Turbo decoded in accordance with the selected hypothesis (i.e., the particular scale value $w_h$), at step 716. This may entail retrieving from the storage unit the input bits $u_k$ for the code segment and decoding the bits with the scale selection $w_h$ (e.g., using the lookup table for $w_h$) to provide a candidate sequence of decoded bits. The quality of the decoded result is then determined based on one or more performance metrics, at step 718. The remaining processing in steps 720, 722, 724, and 726 are similar to that for steps 620, 622, 624, and 626, respectively, in FIG. 6.

The decoding scheme shown in FIG. 7 thus decodes a code segment based on a particular sequence S but a set of scale selections $w_h$, and provides the decoded result corresponding to the best scale selection, as determined by the performance metric.

In another Turbo decoding scheme, a code segment is decoded in accordance with a number of hypotheses formed with a particular scale selection w but different sequences $S_h$ of scaling factors. For example, the sequences $S_h$ of scaling factors may be selected as $S_0$, $2S_0$, $S_0/2$, and so on. Initially, the received bits $v_k$ in the code segment are stored to a storage unit. For each hypothesis to be evaluated, the received bits $v_k$ in the code segment are retrieved from the storage unit, scaled in accordance with the sequence $S_h$ of scaling factors for the hypothesis being evaluated, and quantized to the desired number bits to obtain the input bits $u_k$.

The input bits $u_k$ are then Turbo decoded in accordance with the scale w to generate a candidate segment of decoded bits. Again, the quality of the decoded result is determined based on one or more performance metrics. Other hypotheses for other sequences $S_h$ of scaling factors are also evaluated in similar manner. The decoded result corresponding to the best sequences $S_h$, as determined by the performance metric, is then provided as the Turbo decoder output.

For the above Turbo decoding scheme, different scaling is performed on the received bits $v_k$ to derive the input bits $u_k$ for the Turbo decoder. Since each received bit $v_k$ may have many bits of resolution (e.g., 16 bits), the storage requirement to store an entire code sequence of received bits may be large.

To reduce the storage requirement, the received bits $v_k$ may be successively scaled, quantized, and evaluated, starting with the sequence of largest scaling factors. For example, if the selected sequences are $S_0$, $2S_0$, and $S_0/2$, then the received bits may be initially scaled by $2S_0$ and stored for the first hypothesis. For the next hypothesis, the stored bits are retrieved, scaled again by a factor of 0.5 (to obtain $S_0$), quantized, and evaluated. And for the third hypothesis, the stored bits are retrieved, scaled again by another factor of 0.5 (to obtain $S_0/2$), quantized, and evaluated. The storage requirement is thus reduced to the storage size required for the largest scaling factors. However, successive scaling and quantization typically increase the amount of quantization noise, which may degrade decoding performance.

In yet another Turbo decoding scheme, a code segment is decoded in accordance with a number of hypotheses formed with a specific sequence S of scaling factors but various scale values $w_h$. Initially, the received bits $v_k$ in a code segment are scaled, quantized, and stored to a storage unit as the input bits $u_k$. For each hypothesis to be evaluated, the input bits $u_k$ in the code segment are retrieved from the storage unit and evaluated afresh in accordance with the scale value $w_h$ for that hypothesis.

However, for this decoding scheme, a smaller number of iterations are executed for each hypothesis. For example, 3, 5, or some other number of iterations may be performed for each hypothesis instead of 15, 17, or 19 which may normally be needed to completely decode the code segment. The smaller number of iterations for each hypothesis may allow more hypotheses to be evaluated for a given amount of time. For each hypothesis, the quality of the decoding result is evaluated based on one or more performance metrics. The hypothesis with the best performance is then used to completely decode the code segment, which is then provided as the Turbo decoder output.

Various variations of the Turbo decoding schemes described herein may also be implemented and are within the scope of the invention. In general, any number of hypotheses may be evaluated, with each hypothesis including any specific set of values for any set of parameters (e.g., sequence of scaling factors and/or scale). Moreover, each hypothesis may be evaluated in various manners (e.g., partial or complete decoding).

Performance Metrics

As noted above, various performance metrics may be used to determine the quality of the decoded result. These metrics include (1) CRC check, (2) the minimum or average LLR for the decoded bits in a candidate sequence, (3) the number of iterations completed when a decoded segment is declared, (4) the correlation metric, (5) the re-encoded energy, and (6) the re-encoded bit error rate (BER). These metrics are described below.

A code segment may include CRC bits that can be used to check the decoded result. If the CRC check passes, then there is a high likelihood that the code segment has been decoded error free. If multiple candidate sequences for multiple hypotheses pass the CRC check, then one of the sequences may be selected (e.g., arbitrarily, via some criteria, or via some other metrics).

The minimum or average LLR among the decoded bits in a candidate sequence (after the final iteration) may be used as a performance metric. In some applications, a code sequence may be deemed unacceptable if any one of the information bits in the code sequence is received in error. And in some other applications, errors for a small number of information bits in the code sequence may be acceptable. Thus, depending on the requirement of the application, the worst LLR (i.e., the LLR with the smallest magnitude) or a number of worse LLRs may be used as an indication of the quality of the decoded segment. An average of a number of worse LLRs may also be used as a performance metric.

Turbo decoding is typically performed for a number of iterations (e.g., 12, 16, 20, or possibly more) by the first and second constituent decoders before declaring a decoded segment. With each iteration by a constituent decoder, the confidence in the received information bits may increase and asymptotically reach a final value. A Turbo decoder may employ checks during the decoding process to terminate the decoding if the LLRs for the bits in the code segment exceed a particular threshold value. Alternatively, the Turbo decoder may use a built-in error detecting function (e.g., CRC check) to determine whether decoding has been successful and can be terminated before reaching the maximum number of allowed iterations. In these cases, the number of iterations performed to decode the code segment may be used as a performance metric.

The correlation metric may be obtained by performing an inner product of the decoded bits $b_k$ in a candidate sequence with the received information bits $\tilde{x}_k$ (either before or after the scaling and quantization). This inner product may be achieved by multiplying the candidate sequence with the received information bit sequence, element-by-element (i.e., bit-by-bit), and accumulating the resultant products of the multiplications. The final accumulated value represents the correlation between the two sequences. This inner product can be expressed as:

$$M_e(\tilde{x}, b) = \sum_{k=1}^{N} \tilde{x}_k \cdot b_k. \quad \text{Eq (15)}$$

A high value for the correlation metric $M_e$ indicates a high degree of correlation between the received and decoded bits. Conversely, a low value for the correlation metric indicates errors in the decoded bits and/or low values for the received bits. A higher value for the correlation metric thus corresponds to a higher quality decoded result.

A correlation between the power of the received and decoded bits may also be computed. In this case, each received information bits and each decoded bit is first squared. The inner product is then performed on the vectors of squared decoded bits and squared received information bits.

For the re-encoded correlation metric, the decoded bits $b_k$ in the decoded segment are first re-encoded by the same Turbo encoder and punctured with the same puncturing scheme used at the transmitter unit to derive the re-encoded bits $r_k$. The re-encoded bits $r_k$ are then correlated with the received bits $u_k$ or $v_k$. However, the correlation is performed for all received information and parity bits, and not just for the received information bits as is the case for the correlation metric. The inner product for the re-encoded correlation metric can be expressed as:

$$M_{re}(u, r) = \sum_{k=1}^{3N} u_k \cdot r_k. \quad \text{Eq (16)}$$

Similar to the correlation metric described above, a higher value for the re-encoded correlation metric $M_{re}$ corresponds to a higher quality decoded result. The re-encoded correlation metric may be more accurate than the correlation metric because all received information and parity bits (and not just the information bits) are evaluated by the metric.

The re-encoded bit error rate may be obtained by re-encoding a candidate sequence and comparing the re-encoded bits, bit-by-bit, with the received information and parity bits (which have been transformed to hard-decision or binary values). During the comparison, errors between the re-encoded bits and received bits are counted. The re-encoded BER is then determined as the number of bit errors divided by the total number of bits compared. A lower value for the re-encoded BER is indicative of a higher quality decoded result.

Some of the above performance metrics are described in further detail in U.S. Pat. No. 6,175,590, entitled "METHOD AND APPARATUS FOR DETERMINING THE RATE OF RECEIVED DATA IN A VARIABLE RATE COMMUNICATION SYSTEM," issued Jan. 16, 2001, assigned to the assignee of the present application. Other performance metrics may also be used and are within the scope of the invention. Also, any combination of performance metrics may be used to determine the quality of the decoded result.

Figure 8:
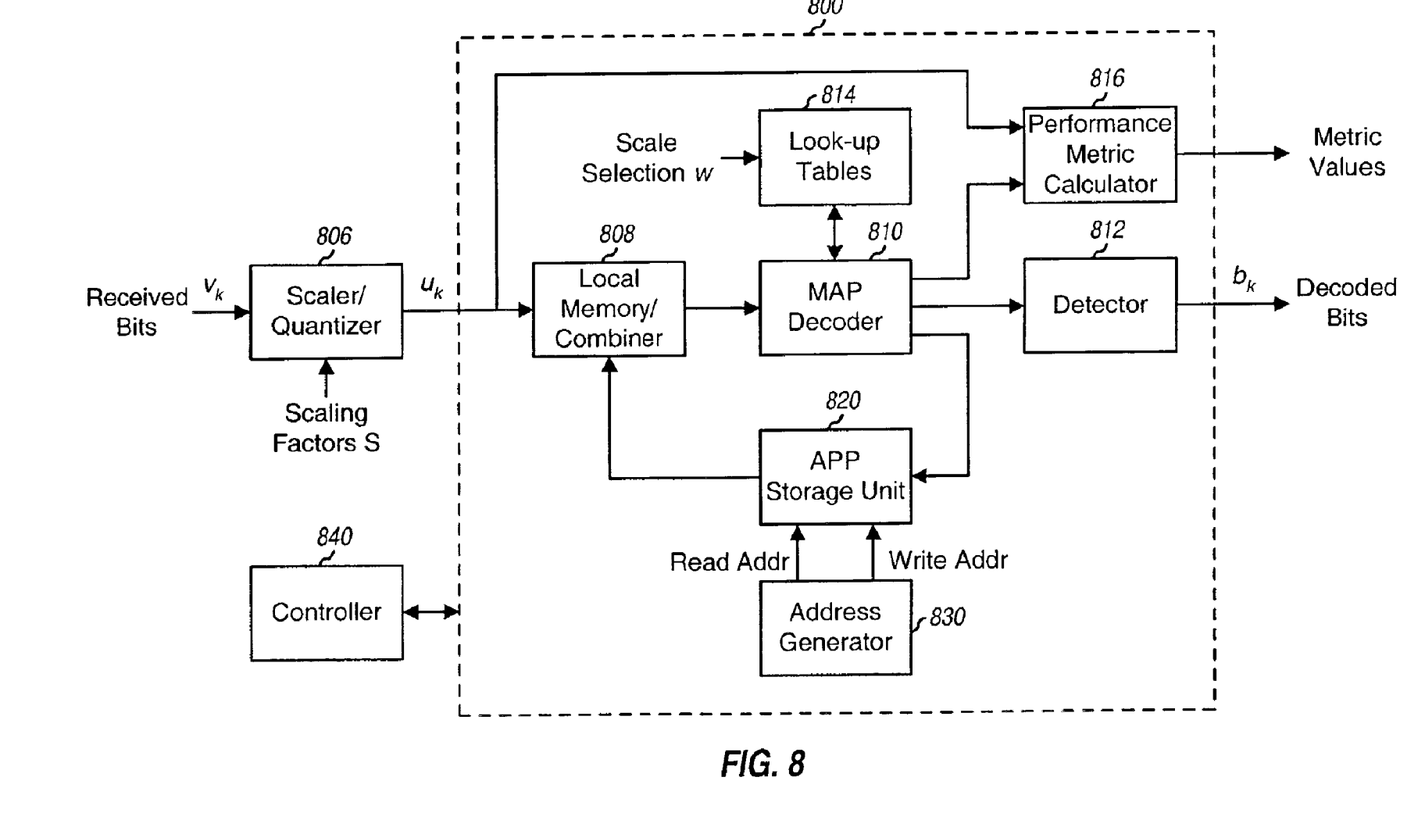
FIG. 8 is a block diagram of a Turbo decoder in accordance with an embodiment of the invention.

FIG. 8 is a block diagram of a Turbo decoder 800, in accordance with an embodiment of the invention. Turbo decoder 800 is one specific implementation of Turbo decoders 316 in FIGS. 3 and 4. In this embodiment, Turbo decoder 800 includes a local memory/combiner 808, a MAP decoder 810, a detector 812, lookup tables 814, a performance metric calculator 816, a storage unit 820, and an address generator 830. Referring back to FIG. 4, the two constituent decoders 410a and 410b are operated in series, with the extrinsic information from one decoder being provided as an input to the other decoder. Because of the serial operation of the two constituent decoders, only one (physical) decoder can be used to implement both constituent decoders.

A scaler/quantizer 806 receives and scales the received bits $v_k$ with the sequence S of scaling factors, quantizes the scaled bits, and provides the quantized bits $u_k$ to local memory/combiner 808. The received bits may be de-punctured, if puncturing was performed at the transmitter unit, by another unit (e.g., a channel interleaver) prior to being provided to Turbo decoder 800. The de-puncturing is achieved by providing an erasure for each punctured bit in the code segment, with the erasure being indicative of equal likelihood of the bit being a zero or a one. Or the received symbols corresponding to identical bits may be combined in an appropriate fashion if the bits were repeated.

Depending on the particular decoding iteration being performed (i.e., decoding for the first or second constituent encoder), the proper sequence of information and parity bits is provided to memory/combiner 808. The APP obtained from a prior decoding iteration is also provided to memory/combiner 808 from APP storage unit 820. In an embodiment, memory/combiner 808 is designed to (1) receive the information bits $\tilde{x}_k$ and compute the LLR for these bits, $LLR(\tilde{x}_k)$, (2) combine the $LLR(\tilde{x}_k)$ computed in step (1) with the corresponding extrinsic information to generate APP, and (3) receive the parity bits (either $\tilde{y}_k^1$ or $\tilde{y}_k^2$) and compute the LLR for the these bits, $LLR(\tilde{y}_k^1)$ or $LLR(\tilde{y}_k^2)$.

In an embodiment, memory/combiner 808 is implemented using a sliding window architecture (SWA) that temporarily stores, e.g., four windows worth of information and parity bits. While three windows of information and parity bits are being operated on by three state metric calculators within MAP decoder 810, the fourth window is updated with values for the information bits and the APP from storage unit 820. In an embodiment, each window has a size of 32, i.e., each window holds 32 $\tilde{x}_k$ symbols and 32 $\tilde{y}_k^1$ (or $\tilde{y}_k^2$) symbols. Other window lengths and/or different number of windows may also be used, and this is within the scope of the invention.

In an embodiment, MAP decoder 810 implements a SISO decoder that executes a log-MAP algorithm. Any MAP-based decoding algorithm (e.g., a max log-MAP algorithm or a max* log-MAP algorithm, both of which are known in the art) may also be used. In an embodiment, to implement the MAP algorithm, MAP decoder 810 includes one forward state metric calculator and two backward state metric calculators. Each forward (or backward) state metric calculator computes the logarithm of the probability of each of $2^{K-1}$ states in the trellis at a given time instance k based on (1) the probabilities of the states at a previous (or future) time instance and (2) the probabilities of the path between the previous (or future) states and the state in the current time, where K is the constraint length of the constituent encoder. These forward and backward state metrics are then used to compute a posteriori probabilities for the information bits. The forward and backward state metric calculations are described above.

Lookup tables 814 may be used to expedite the evaluation of the min* function, which is used to compute the forward and reverse state metrics and the branch metric, as described above. A number of lookup tables may be provided for different scale values w, and the particular lookup table to be used may be determined by the scale selection (which may be provided by a controller 840).

Performance metric calculator 816 may be used to compute one or more performance metrics for a candidate sequence, which is used to determine the quality of the decoded result. Performance metric calculator 816 may perform the CRC check and/or determine the minimum or average LLR, the correlation metric, the re-encoded energy, the re-encoded BER, some other metrics, or any combination thereof.

Storage unit 820 stores the APP from a decoding iteration, which is then used for the next decoding iteration. The APP are stored to and retrieved from the proper locations in storage unit 820 as directed by the write and read addresses provided by address generator 830. The addresses are generated such that the APP are properly interleaved and de-interleaved in accordance with the interleaving scheme used to encoded the code segment at the transmitter unit.

Controller 840 may direct the operation of Turbo decoder 800. Controller 840 may formulate a number of hypotheses for a code segment and provides control signals indicative of the scaling factors and scale values to be used for the code segment. Controller 840 may further receive the values for the performance metrics computed for the hypotheses, and selects one of the hypotheses as the best hypothesis. The decoded bits for the best hypothesis are then provided from Turbo decoder 800.

Various aspects of the decoding techniques have been described for a Turbo decoder design that employs a set of lookup tables to implement the min* function for different scale values w. However, these decoding techniques are not restricted to the use of lookup tables and the min* function may be evaluated using other means, including hardware, software, firmware, or any combination thereof.

The decoding techniques described herein may be advantageously used for Turbo decoding a code segment when the scale information is not known. These techniques may be used for any communication system that employs Turbo decoding such as cdma2000, W-CDMA, IS-856, and others. These techniques may also be employed on the forward link (i.e., downlink) as well as the reverse link (i.e., uplink).

Beside the scaling factors and scale values, other parameters may be adjusted for the Turbo decoding (e.g., the number of iterations, window size, and possibly others). Also, the techniques described herein may be applied to other types of decoder beside a Turbo decoder. For example, the scaling concept may also be applied to a Viterbi decoder, except that there is only one variable (the scaling factors S) since the Viterbi decoder is independent of w.

The Turbo decoder described herein may be implemented in hardware, software, firmware, or a combination thereof. For a hardware design, the Turbo decoder may be implemented within a digital signal processor (DSP), an application specific integrated circuit (ASIC), a processor, a microprocessor, a controller, a microcontroller, a field programmable gate array (FPGA), a programmable logic device, other electronic unit, or any combination thereof. And for a software or firmware design, the Turbo decoder may be implemented with codes executed by a processor (e.g., controller 840 in FIG. 8). The storage unit and lookup tables may also be implemented with various memory technologies such as, for example, random access memory (RAM), dynamic RAM (DRAM), Flash memory, and others. Various structures and implementations of the Turbo decoder and storage unit are possible and within the scope of the present invention.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method of decoding a Turbo encoded code segment, comprising:
    forming a plurality of hypotheses for the code segment, wherein each hypothesis corresponds to a particular set of one or more values for a set of one or more parameters used for decoding the code segment;
    decoding the code segment in accordance with each of the hypotheses;
    evaluating one or more performance metrics for a decoded result for each of the hypotheses;
    determining a particular hypothesis having a best decoded result based on the one or more evaluated performance metrics; and
    providing a sequence of decoded bits for the hypothesis with the best decoded result.

2. The method of claim 1, wherein the decoding is performed for a particular number of iterations for each of the hypotheses, and wherein the one or more performance metrics are evaluated for each hypothesis after completing the particular number of iterations.

3. The method of claim 2, wherein the particular number of iterations is less than that required to completely decode the code segment.

4. The method of claim 1, wherein the decoding is performed based on a maximum a posteriori (MAP) decoding scheme.

5. The method of claim 4, wherein the MAP decoding scheme utilizes a function for decoding the code segment, and wherein the set of one or more parameters includes at least one parameter for the function.

6. The method of claim 5, wherein the function is a min* function.

7. The method of claim 5, wherein the function is implemented in part with a set of lookup tables corresponding to different values for the function parameter.

8. The method of claim 1, wherein the set of one or more parameters includes a parameter for a sequence of scaling factors used to scale bits received for the code segment to derive bits to be decoded.

9. The method of claim 8, wherein the plurality of hypotheses correspond to a plurality of sequences of scaling factors.

10. The method of claim 5, wherein the set of one or more parameters includes a parameter for a scale used to evaluate the function.

11. The method of claim 10, wherein the plurality of hypotheses correspond to a plurality of scale values.

12. The method of claim 8, wherein the set of one or more parameters further includes a parameter for a scale used to evaluate a function for decoding the code segment, and wherein the plurality of hypotheses correspond to a plurality of combinations of sequences of scaling factors and scale values.

13. The method of claim 1, wherein the one or more performance metrics include a CRC check.

14. The method of claim 1, wherein the one or more performance metrics include a correlation metric.

15. The method of claim 1, wherein the one or more performance metrics include a re-encoded correlation metric.

16. The method of claim 1, wherein the one or more performance metrics include a minimum or average log likelihood ratio (LLR) of the decoded bits.

17. A method of decoding a Turbo encoded code segment, comprising:
forming a plurality of hypotheses for the code segment, wherein each hypothesis corresponds to a particular set of one or more values for a set of one or more parameters used for decoding the code segment;
decoding the code segment based on a maximum a posteriori (MAP) decoding scheme and in accordance with each of the hypotheses;
evaluating one or more performance metrics for a decoded result for each of the hypotheses;
determining a particular hypothesis having a best decoded result based on the one or more evaluated performance metrics; and
providing a sequence of decoded bits for the hypothesis with the best decoded result, and
wherein the set of one or more parameters includes a parameter for a scale for a min* function used to implement the MAP decoding scheme.

18. A Turbo decoder comprising:
a constituent decoder configured to receive and decode bits for a code segment based on a particular decoding scheme and in accordance with a particular hypothesis to provide a decoded result for the hypothesis; and
a performance metric calculator configured to evaluate one or more performance metrics for the decoded result for the hypothesis, and
wherein a plurality of hypotheses are formed for the code segment,
wherein each hypothesis corresponds to a particular set of one or more values for a set of one or more parameters used for decoding the code segment, and wherein the constituent decoder and performance metric calculator operate on the code segment for each of the hypotheses.

19. The Turbo decoder of claim 18, wherein the constituent decoder is a maximum a posteriori (MAP) decoder.

20. The Turbo decoder of claim 19, further comprising:
a plurality of lookup tables configured to implement a function for the MAP decoder, wherein each lookup table corresponds to a particular scale value for the function, and
wherein the plurality of hypotheses correspond to a plurality of scale values to be used for decoding the code segment.

21. The Turbo decoder of claim 20, wherein the plurality of lookup tables are configured to implement a min* function for the MAP decoder.

22. The Turbo decoder of claim 18, wherein the bits to be decoded are derived by scaling received bits with a sequence of scaling factors, and wherein the plurality of hypotheses correspond to a plurality of sequences of scaling factors.

* * * * *